US006144235A

United States Patent [19]

Marano et al.

[11] Patent Number: 6,144,235

[45] Date of Patent: Nov. 7, 2000

[54] CONTROL CIRCUIT FOR A MOTOR-OPERATED SWITCH

[75] Inventors: James R. Marano, Cedar Rapids; Kevin J. Malo, Iowa City; Steven M. Meehleder, Cedar Rapids, all of Iowa

[73] Assignee: Square D Company, Palatine, Ill.

[21] Appl. No.: 09/143,916

[22] Filed: Aug. 31, 1998

[51] Int. Cl.[7] .......... H03B 1/00

[52] U.S. Cl. .......... 327/110; 327/227

[58] Field of Search .......... 307/23, 29, 64, 307/68, 85, 86; 318/65, 103, 256, 283, 294, 739, 767, 778, 782, 806; 327/108, 110, 227

[56] References Cited

U.S. PATENT DOCUMENTS 5,790,399 8/1998 Campbell .......... 364/140
6,020,702 2/2000 Farr .......... 318/434

OTHER PUBLICATIONS

Schematic No. B48128–233 "PA–PE Motor Operator," Square D Company, Jan. 1996.

*Primary Examiner*—Jeffrey Zweizig
*Attorney, Agent, or Firm*—Kareen M. Irfan; Larry I. Golden

[57] ABSTRACT

A motor control circuit controls operation of a motor for making or breaking one or more pairs of contacts of a power switching device such as a circuit breaker. The motor control circuit includes a logic circuit responsive to a control input signal and an enable signal for producing an active signal state when both the control signal and the enable signal are present, and for producing an inactive logic signal state when either of the control signal and the enable signal is not present. A switching control signal producing circuit is responsive to said active state of the logic signal for producing a switching control signal for operating the motor for a predetermined time interval sufficient to perform one of opening and closing of the one or more pairs of contacts.

28 Claims, 5 Drawing Sheets

CONTROL CIRCUIT FOR A MOTOR-OPERATED SWITCH

BACKGROUND OF THE INVENTION

This invention is directed generally to motor control circuits and more particularly to a motor control circuit for control of a motor which is used to operate a switch, such as a switch for switching of a power circuit or a power switching device such as a circuit breaker.

Generally speaking, a power switching device such as a circuit breaker may include one or more pairs of contacts and a mechanism for making or breaking these contacts. In the case of relatively high current power circuits, it may be impractical to manually throw a switch which makes or breaks the contacts of the power switching device or circuit breaker. Often, in such circuits a remotely controlled device such as a motor is used. In the case of relatively heavy circuit breakers for high current applications, the element used to close the contacts is provided with a substantial amount of closing force, for example by spring loading, to reliably close the contacts and avoid arcing, as well as to minimize contact resistance in the relatively high current circuit. Thus, a correspondingly large amount of force is required to break the contacts, that is, pull the contact closing device away from the contacts when it is desired to open the circuit, or "trip" the circuit breaker. Commonly used devices from lower current circuits such as solenoids generally do not provide the forces required to make and break such contacts in relatively high current circuits. While a relatively large handle or lever might be provided to manually make or break the contacts, because of arcing and the like associated with the making and breaking of high current circuits, it is desirable to provide a remotely controlled device. Moreover, the manual force required to be applied to such a lever may also be considerable.

Generally speaking, a motor is used in such situations. Usually, the motor is a relatively high torque motor and is provided with gearing, such that the motor revolutions are geared down to provide both the required force and the required rotary motion of a lever for making and breaking the contacts. Since only a limited amount of motion is necessary to completely make and break the contacts, usually the motor is only turned for a relatively short period of time, to achieve the revolutions and resultant motion through the associated gearing to completely make and break the contacts. In relatively high current circuits of this type, the motion provided for breaking of the contacts usually is such that the member or device for closing the contacts is moved a sufficient distance from the contacts to prevent any arcing therebetween when the contacts have been completely opened.

While various circuits have been used for motor control in the above-described situation, there is room for further improvement. Accordingly, the present invention presents a novel and improved motor control circuit for controlling a motor used to open or close one or more pairs of contacts in a power switching device such as a circuit breaker.

Moreover, in one application, it is desired to switch between line power and generator power, wherein both the line and generator comprises relatively high current power sources. However, in this application it is also desirable to delay the switching from the line to the generator until the generator has reached its operating voltage or a predetermined percentage of its operating voltage.

OBJECTS OF THE INVENTION

Accordingly, it is a general object of the invention to provide a novel and improved motor control circuit for controlling operation of a motor for making and breaking one or more pairs of contacts of a power switching device such as a circuit breaker.

A further object is to provide a motor control circuit in accordance with the foregoing object which can also be used to switch between the line power and generator power in accordance with the foregoing discussion.

SUMMARY OF THE INVENTION

Briefly, in accordance with the foregoing, a motor control circuit for controlling operation of a motor for making or breaking one or more pairs of contacts of a power switching device such as a circuit breaker, comprises a logic circuit responsive to a control input signal and an enable signal for producing an active logic signal state when both the control signal and the enable signal are present, and for producing an inactive logic signal state when either of the control signal and the enable signal is not present, and a switching control signal producing circuit responsive to said active state of said logic signal for producing a switching control signal for operating said motor for a predetermined time interval sufficient to perform one of opening and closing of said one or more pairs of contacts.

DETAILED DESCRIPTION OF THE ILLUSTRATED EMBODIMENT

Figure 1A:
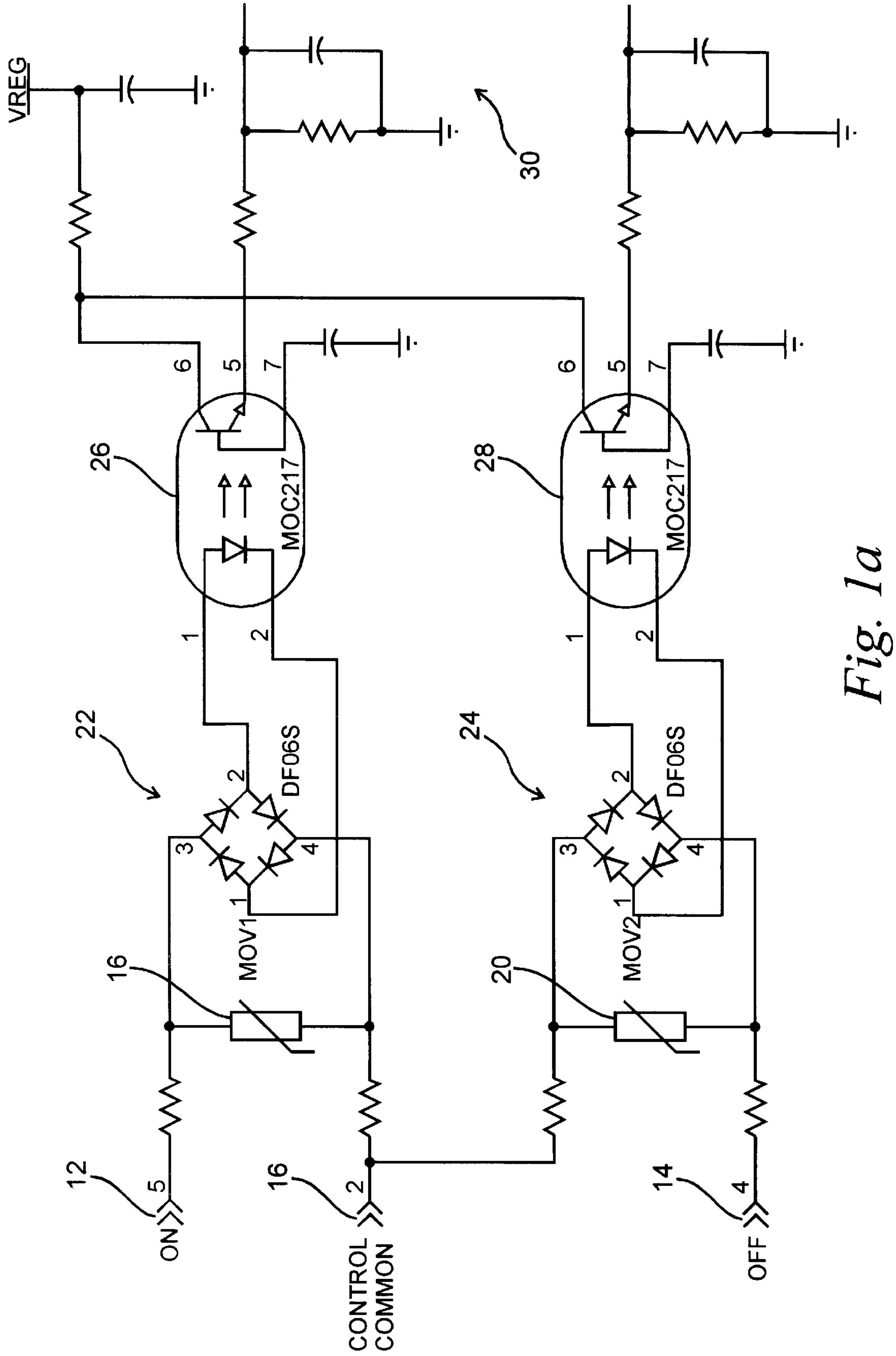
FIGS. 1*a*–1*d* is a schematic circuit diagram of a motor control circuit in accordance with one embodiment of the invention.

Referring now to the drawings, and initially to FIGS. 1*a*–1*d*, a motor control circuit in accordance with the invention is designated generally by the reference numeral 10. The circuit 10 has a first pair of inputs 12, 14 for receiving respective "on" and "off" control signals and a control signal common input 16. The control signal inputs and related circuitry are designed for operation with control signals which may vary over a considerable range, including from substantially 24 to substantially 48 volts dc as well as from substantially 102 to 132 volts ac at 50 or 60 hertz. These inputs are also provided with protective devices in the form of respective 300 volt metal oxide varistors (MOV) 18, 20 which are placed across each of the inputs 12, 14 and the control common input 16. Each input is also provided with a full wave rectifier bridge 22, 24. In order to fully isolate the input signals from a control logic portion 30 of the circuit 10, each of the control signal inputs is also provided with an opto-isolator 26, 28 which receives the output signal from a corresponding one of the full wave rectifiers 22, 24. Thus, from a considerable range of acceptable input signals at the inputs 12 and 14, each of the opto-isolators 26, 28 produces a relatively stable, predictable, low level logic signal which may be readily utilized by the logic components of the control logic circuit 30.

In the illustrated embodiment, the control logic circuit 30 includes three, two-input NAND gates, 32, 34 and 36. The third NAND gate 36 has its two inputs wired together to function as an inverter buffer.

Each of the NAND gates 32 and 34 has a first or control signal input which is fed from the output of a corresponding one of the opto-isolators 26, 28 so as to respond to the respective corresponding one of the control signals at the inputs 12 and 14. A second, or enable input of each of the NAND gates 32 and 34 is coupled to the output of a power source voltage monitoring circuit 40.

Figure 2:
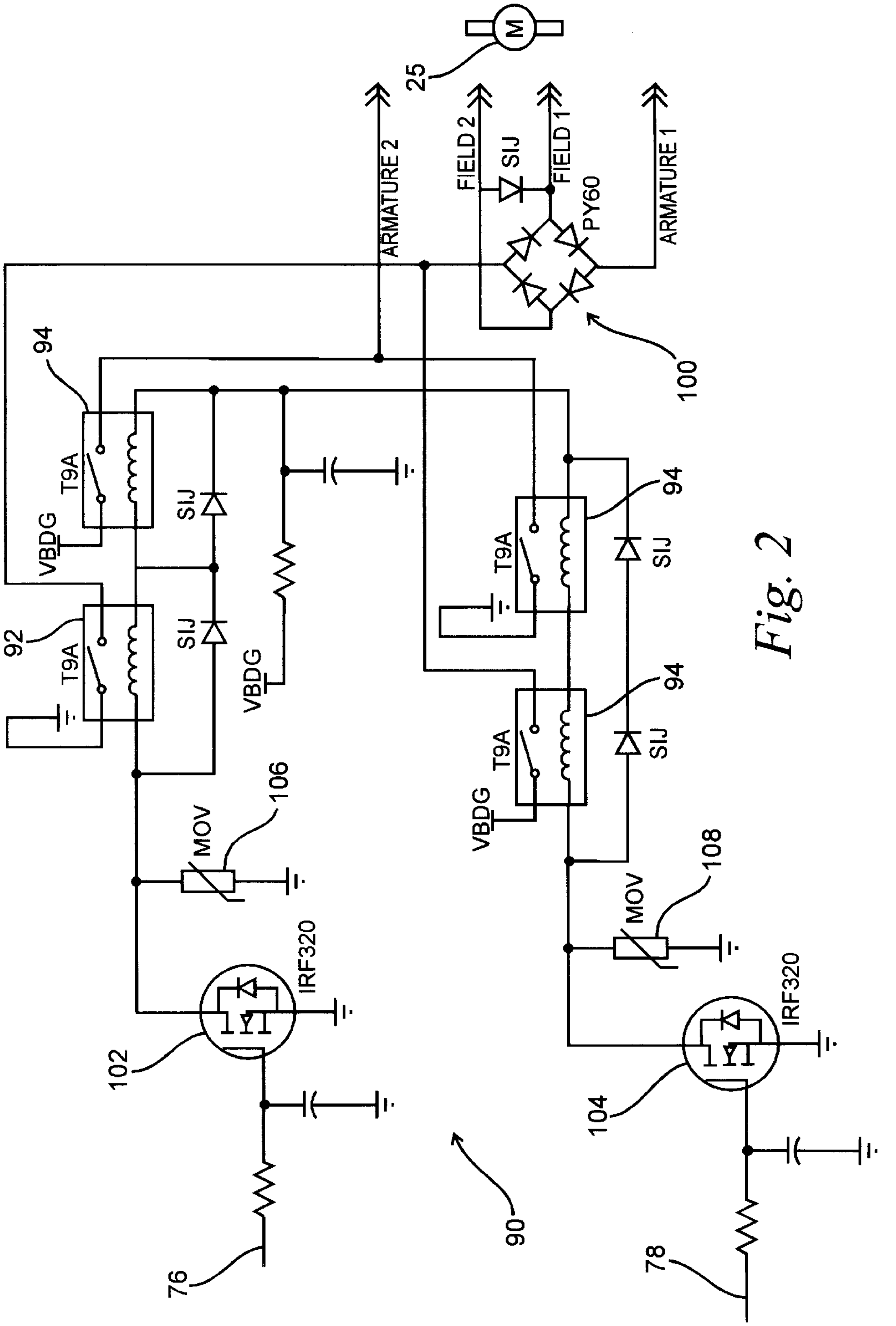
FIG. 2 is a schematic circuit diagram of a relay switching circuit responsive to the circuit of FIGS. 1*a*–1*d* for controlling operation of a motor.

The power source voltage monitoring circuit 40 has line and neutral inputs 42, 44 from a nominally 120 VAC powerline which also supplies power to the motor 25 (see FIG. 2). The power source voltage monitoring circuit includes a full wave rectifier bridge 46 which is coupled the inputs 42, 44 and has an output protected by a further 300 volt MOV 48. The rectifier bridge 46 provides an unregulated dc output voltage VBDG of approximately 170 volts dc. This same output is also coupled to a pair of 51 volt zener diodes 50, 52 which are wired in series so as to effectively give an approximately 102 volt zener breakdown voltage. In practice, the breakdown voltage is approximately 92 VAC±5 VAC, such that an output current will appear at the other side of the zener diodes 50, 52 when the voltage at the output of the rectifier bridge 46 exceeds approximately 92 VAC±5 VAC. This output is regulated to approximately 12 volts dc by a further zener diode 54 and is filtered by associated RC circuit components. This 12 volt dc filtered signal is provided as the enable input to the second or enable inputs of each of the NAND gates 32 and 34. The circuit point at which the 12 volt dc filtered signal provided at the zener diode 54 is designated by reference numeral 55, and will be referred to further later herein.

The circuit 40 operates as a low voltage lockout, to prevent operation of the motor to close the contacts until the monitored line 42, 44 is at a voltage close to its operating voltage (120 VAC), here selected as 92 VAC±5 VAC. This feature is useful when using the contacts to switch from line power to generator power, by permitting monitoring of the generator output voltage, to delay switching until the generator output voltage is near its operating voltage.

The regulated 170 volts dc VBDG is fed through a current limiting resistor 56 to a voltage regulator circuit including a 10 microfad filter capacitor 58, a 27 volt zener diode 60 and an integrated circuit voltage regulator 62, which in the illustrated embodiment is a voltage regulator of the type generally designated LP2951. The voltage regulator 62 provides a 15 volt dc regulated output voltage VREG at an output 64, and an error signal (ERR) at an output 65, when it is out of regulation. This error signal at circuit point 65 also pulls down the enable signal at circuit point 55 through a connected diode 67 and resistor 69, thus preventing this enable signal from reaching the following logic control circuit.

Referring now to the logic control circuit 30, the NAND gates 34 and 36 produce active logic state output signals, when both the control and enable signals are present at the inputs of the NAND gates 32 and 34. The outputs of the NAND gates 34 and 36 produce an inactive state logic signal when either of the control signals or enable signal is absent at the corresponding NAND gate inputs. A switching control signal producing circuit 70 is responsive to the active states of the logic signals produced by the NAND gates 34 and 36 for producing switching control signals for operating the motor for a predetermined time interval sufficient to open or close the one or more pair of contacts to be operated by the motor.

In the illustrated embodiment, the switching control signal producing circuit 70 comprises a pair of monostable multivibrators (MMV) 72 and 74, which may comprise an integrated circuit component of the type generally designated as Motorola MC14538B dual precision retriggerable/resettable monostable multivibrator. The MMVs 72 and 74 produce the switching control signals at their respective outputs 76 (ON signal) and 78 (OFF signal). The ON signal is used to drive the motor in a direction for making or closing the associated contacts while the OFF signal drives the motor in a direction for breaking the associated contacts. Each of the MMVs is provided with a suitable timing control circuit 80, 82 which sets the time interval during which the MMV remains in its on or active state following triggering thereof by the logic signals from respective gates 34 and 36. This time interval defines the length of the active or on state of the respective ON or OFF signals, and may be adjusted or varied by adjusting the values of the components selected for use in the circuits 80 and 82. In the illustrated embodiment, these components are selected to provide an output signal of a nominal length of 332 milliseconds, with a range of between 290 and 360 milliseconds. The NAND gates 32, 34 and 36 may be individual components of a Motorola MC14093B quad two-input NAND Schmitt trigger.

Referring now to FIG. 2, a motor drive circuit is illustrated. A motor drive circuit 90 of FIG. 2 includes four relays 92, 94, 96 and 98 in an H-bridge arrangement for driving two single phase windings of the motor 25. The connections of these relays to the respective armature and field windings of the motor 25. The four way rectifier bridge 100 is illustrated in FIG. 2. The relays 92, 94, 96, 98 may be 24V, 30A type T9A relays.

Figure 1B:
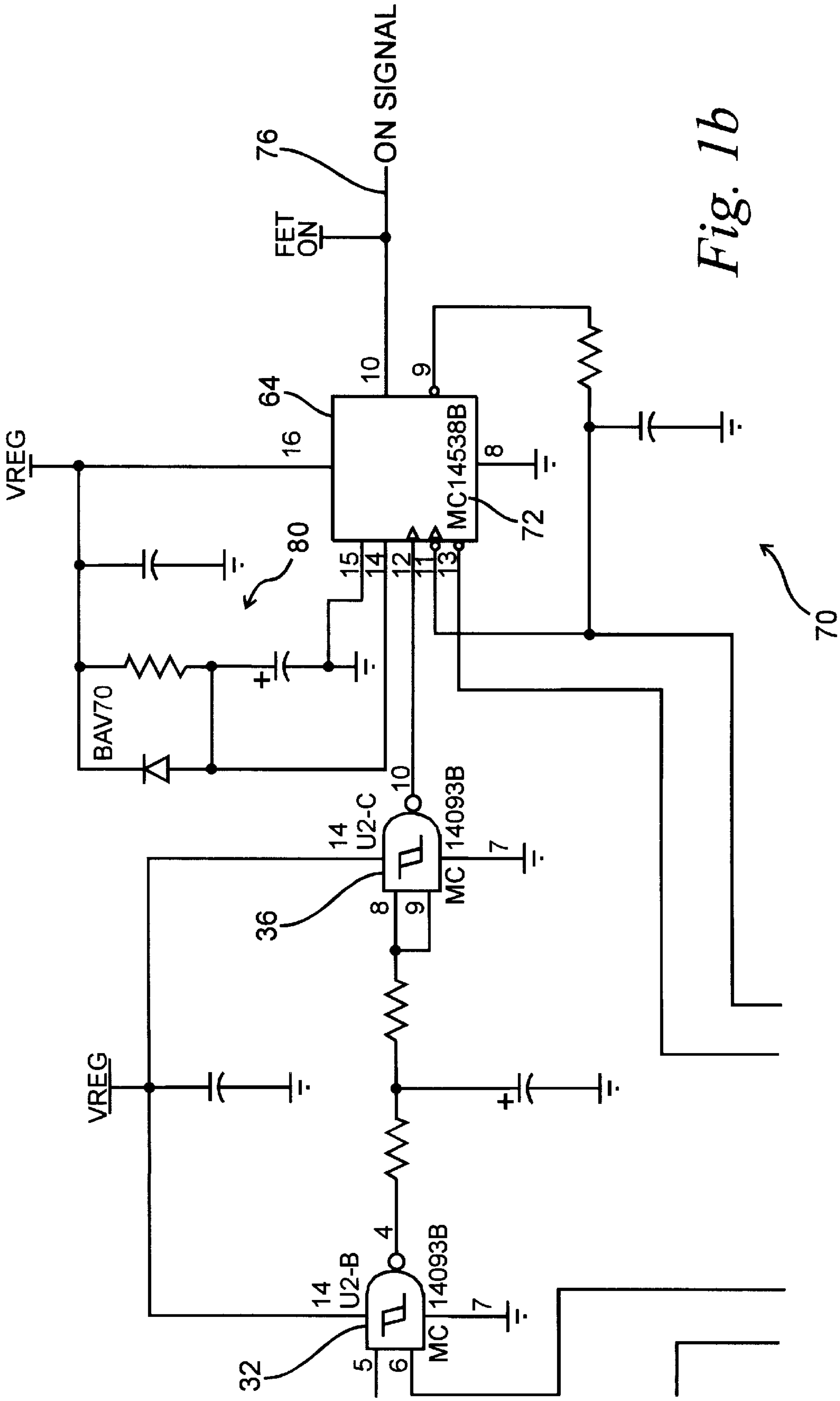
Figure 1C:
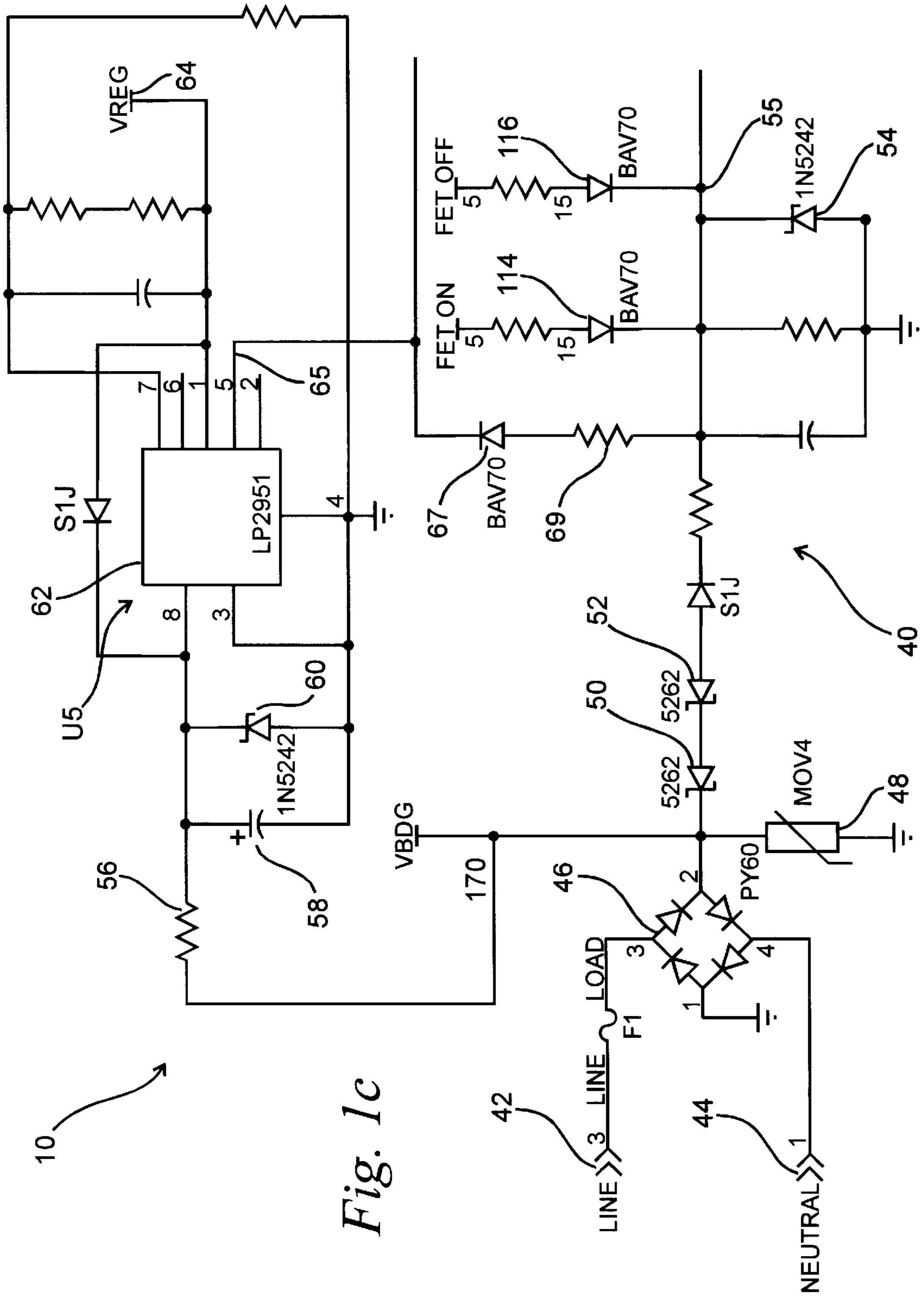
Figure 1D:
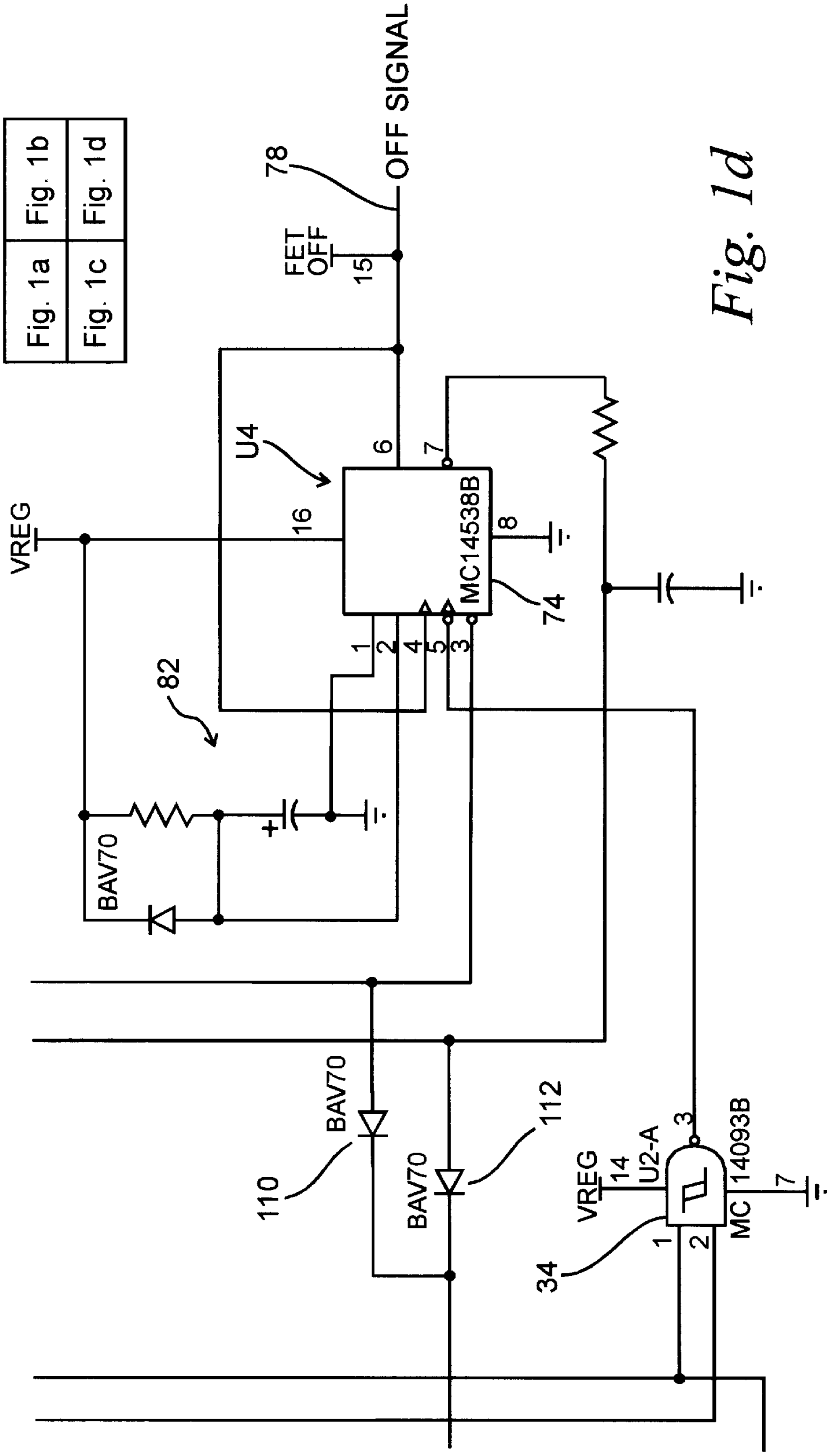

The ON and OFF signals at the terminals 76 and 78 of FIGS. 1*b*–1*d* are fed to a pair of MOSFET switches 102, 104 which when switched into the active state send current through the relay coils of the relays respectively coupled thereto. The circuits are further protected by respective 150 volt MOVs 106 and 108. The unregulated dc voltage VBDG provides power to the relay coils.

Referring again to FIGS. 1*a*–1*d*, the voltage regulator 62 provides the error signal (ERR), as mentioned above, at an output terminal 65, when it is out of regulation. This error signal output 65 is also coupled to appropriate input and output terminals of the MMVs 72 and 74 as indicated in FIGS. 1*b*–1*d*, to lockout the MMVs from triggering when the output of the regulator 62 is out of regulation to prevent false triggering of the MMVs 72, 74 in response to noise or the like. This may occur, for example when the regulator 62 drops to approximately five percent below its set output, as might occur during momentary power interruptions or the like. These connections with the error signal output 65 are accomplished through a pair of diodes 110, 112.

In order to accommodate a voltage sag in the line 42, 44 which can be caused by a large load such as the peak inrush current of the motor 25, a feedback to the input of the logic circuit 30 is provided from the MMVs 72, 74. This will prevent loss of the enable signal due to a momentary sag in the power at the inputs 42, 44 below the 92 volt±5 volt level required to break down the zener diodes 50, 52 by providing an enable signal for the logic gates 32 and 34 at circuit point 55. Otherwise, during motor start up the enable signal for the NAND Schmitt triggers 32 and 34 might be momentarily reduced below the hysteresis voltage by this voltage sag. Loss of the enable signal during actual operation of one of the MMVs 72, 74 (i.e., during the 332 millisecond output pulse used to switch the drive current to the motor through the circuit of FIG. 2) could reset the MMV, resulting in incomplete motor operation for making or breaking the contacts. This is prevented by feeding back the switching signal from the active MMV output 76 or 78 to the circuit point 55 through respective diodes 114, 116, so that the MMVs in effect are "bootstrapped" during the 332 millisecond ON or OFF signal. It will be seen that the circuit points FET ON and FET OFF feed into these diodes through current limiting resistors.

What has been illustrated and described herein is a novel and improved motor control circuit for controlling a motor for operating one or more sets of contacts of a power switching device such as a circuit brekaer. The disclosed circuit has a low voltage lockout feature, useful, for example, when the device is being used to switch between line and generator power. The low lockout voltage feature prevents switching until the generator comes up to a predetermined minimum voltage output. The invention also provides an out of regulation lockout feature which prevents triggering of the motor control circuit by noise or the like during momentary power interruptions. The circuit of the invention also provides a feedback to prevent loss of the control signal during a voltage sag caused from a large load such as the peak inrush of the motor.

While the invention has been illustrated and described above with reference to a specific emodiment, the invention is not limited thereto. On the contrary, those skilled in the art may devise various alternatives and modifications upon reading the foregoing description and viewing the accompanying drawings. Such alternatives and modifications are to be understood as forming a part of the invention insofar as they fall within the spirit and scope of the appended claims.

What is claimed is:

1. A motor control circuit for controlling operation of a motor for making or breaking one or more pairs of contacts of a power switching device such as a circuit breaker, said motor control circuit comprising:

a logic circuit responsive to "on" and "off" control input signals and an enable signal for producing an active logic signal state when one of said control signals and said enable signal both are present, and for producing an inactive logic signal state either when neither one of said control signals is present or when said enable signal is not present; and a switching control signal producing circuit responsive to said active state of said logic signal for producing a switching control signal for operating said motor for a predetermined time interval sufficient to perform one of opening and closing of said one or more pairs of contacts.

2. The circuit of claim 1 wherein said switching control signal producing circuit comprises a first monostable multivibrator for producing an ON control signal for operating said motor in a direction for closing said at least one pair of contacts and a second monostable multivibrator for producing an OFF control signal for operating said motor in a direction for opening said at least one pair of contacts.

3. The circuit of claim 1 and further including a power source monitoring circuit for monitoring a voltage level of a power source for providing operating power for the motor, said power source monitoring circuit being responsive to the voltage level of said power source for producing said enable signal only when said voltage level is above a predetermined voltage level.

4. The circuit of claim 3 and further including a dc voltage regulator for providing regulated dc voltage for said logic circuit and having an error output for producing an error signal when said dc voltage regulator is out of regulation, said error signal being coupled to said power source monitoring circuit for preventing said enable signal from reaching said logic circuit.

5. The circuit of claim 4 wherein said switching control signal producing circuit comprises a first monostable multivibrator for producing an ON control signal for operating said motor in a direction for closing said at least one pair of contacts and a second monostable multivibrator for producing an OFF control signal for operating said motor in a direction for opening said at least one pair of contacts.

6. The circuit of claim 4 wherein said error output is further operatively coupled to said switching control signal producing circuit for preventing production of said switching control signal when said error signal is produced.

7. The circuit of claim 3 and further including a feedback circuit from said switching control signal producing circuit to said power source monitoring circuit for producing said enable signal during said predetermined time interval to assure that said switching control signal remains operative for said predetermined time interval for operating said motor, including when said voltage level is below said predetermined level.

8. The circuit of claim 1 and further including an isolation circuit for isolating a control signal input circuit, which receives externally supplied control input signals, from said logic circuit.

9. The circuit of claim 1 wherein said isolation circuit comprises at least one opto-isolator.

10. The circuit of claim 1 and further including control signal input circuits coupled to said logic circuit for accommodating externally supplied control input signals over a wide range of voltages, including both dc and ac voltages and for producing signals for input to said logic circuit at a predetermined, fixed logic level.

11. The circuit of claim 10 wherein each said control signal input circuit comprises a full wave rectifier circuit and an opto-isolator.

12. The circuit of claim 2 and further including circuit components coupled with said first and second monostable multivibrators for setting the length of said predetermined time interval, whereby said predetermined time interval is selectable by selecting the value of said circuit components.

13. The circuit of claim 6 and further including a feedback circuit from said switching control signal producing circuit to said power source monitoring circuit for producing said enable signal during said predetermined time interval to assure that said switching control signal remains operative for said predetermined time interval for operating said motor.

14. The circuit of claim 4 and further including a feedback circuit from said switching control signal producing circuit to said power source monitoring circuit for producing said enable input signal during said predetermined time interval to assure that said switching control signal remains operative for said predetermined time interval for operating said motor.

15. The circuit of claim 2 and further including a dc voltage regulator for providing regulated dc voltage for said logic circuit and having an error output for producing an error signal when said dc voltage regulator is out of regulation, said error signal being coupled in circuit for preventing said enable signal from reaching said control logic.

16. The circuit of claim 15 wherein said error output is further operatively coupled to said monostable multivibrators for preventing production of said switching control signal when said error signal is produced.

17. A method for controlling operation a motor for making or breaking one or more pairs of contacts of a power switching device such as a circuit breaker, said method comprising:

producing an active logic signal state in response to "on" and "off" control input signals and an enable signal when both one of said control input signals and said enable signal are present, and producing an inactive logic signal state when neither of said control signals is present or said enable signal is not present; and producing a switching control signal in response to said active state of said logic signal for operating said motor for a predetermined time interval sufficient to perform one of opening and closing of said one or more pairs of contacts.

18. The method of claim 17 wherein said producing comprises producing an ON control signal for operating said motor in a direction for closing said at least one pair of contacts and producing an OFF control signal for operating said motor in a direction for opening said at least one pair of contacts.

19. The method of claim 17 and further including monitoring a voltage level of a power source for providing operating power for the motor, and producing said enable signal only when said voltage level is above a predetermined voltage level.

20. The method of claim 19 and further including providing regulated dc voltage and producing an error signal when said dc voltage is out of regulation and preventing production of said switching control signal in response to said error signal.

21. The method of claim 20 wherein said producing comprises producing an ON control signal for operating said motor in a direction for closing said at least one pair of contacts and producing an OFF control signal for operating said motor in a direction for opening said at least one pair of contacts.

22. The method of claim 17 and further including producing a feedback signal for maintaining said enable signal during said predetermined time interval to assure that said switching control signal remains operative for said predetermined time interval for operating said motor.

23. The method of claim 19 further including producing a feedback signal for maintaining said enable signal during said predetermined time interval to assure that said switching control signal remains operative for said predetermined time interval for operating said motor, including when said voltage level is below said predetermined level.

24. The method of claim 17 and further including isolating externally supplied control signals.

25. The method of claim 17 and further including converting externally supplied control signals to a predetermined, fixed logic level.

26. The method of claim 18 and further including setting the length of said predetermined time interval by selecting the values of circuit components.

27. The method of claim 20 and further including producing a feedback signal for maintaining said enable signal during said predetermined time interval to assure that said switching control signal remains operative for said predetermined time interval for operating said motor.

28. The method of claim 18 and further including providing a regulated dc voltage, producing an error signal when said dc voltage is out of regulation, and preventing production of said switching control signal in response to said error signal.

* * * * *